United States Patent [19]

Sanders

[11] Patent Number: 4,881,111
[45] Date of Patent: Nov. 14, 1989

[54] RADIATION HARD, HIGH EMITTER-BASE BREAKDOWN BIPOLAR TRANSISTOR

[75] Inventor: Thomas J. Sanders, Indialantic, Fla.
[73] Assignee: Harris Corporation, Melbourne, Fla.
[21] Appl. No.: 973,822
[22] Filed: Dec. 27, 1978

Related U.S. Application Data

[63] Continuation of Ser. No. 771,602, Feb. 24, 1977, abandoned.

[51] Int. Cl.$^4$ .............................................. H01L 29/72
[52] U.S. Cl. ......................................................... 357/34
[58] Field of Search ........................ 357/34, 44, 92, 20

[56] References Cited

U.S. PATENT DOCUMENTS

| | | | |
|---|---|---|---|
| 3,657,612 | 4/1972 | Weidmann | 357/34 |
| 3,880,676 | 4/1975 | Douglas et al. | 357/34 |
| 4,047,217 | 9/1977 | McCaffrey et al. | 357/34 |
| 4,075,039 | 2/1978 | Sloan | 357/44 |
| 4,076,556 | 2/1978 | Agraz-Guerena et al. | 357/92 |
| 4,130,826 | 12/1978 | Bachle et al. | 357/34 |

OTHER PUBLICATIONS

R. Warner et al., "Integrated Circuits-Design Prin. & Fab.", © 1965, Motorola, Inc., TK 7870M63, p. 67.
"The First Motorola Dual J-FET . . . ", Electronics, Nov. 9, 1970, (Un-Numbered Page).

Primary Examiner—Joseph E. Clawson, Jr.
Attorney, Agent, or Firm—Barnes & Thornburg

[57] ABSTRACT

A vertical bipolar transistor including a base having impurity concentration equal in order of magitude to and being formed in the surface of an emitter, a collector having impurity concentration at least two orders of magnitude greater than and being formed in the surface of the base, and a ring having the same impurity conductivity type as the base, having impurity concentration at least three orders of magnitude greater than the base's and being formed at the junction of and in the surfaces of the base and emitter. The ring extends from the surface at to least the depth of the collector and not greater than the depth of the base.

20 Claims, 1 Drawing Sheet

FIG.1
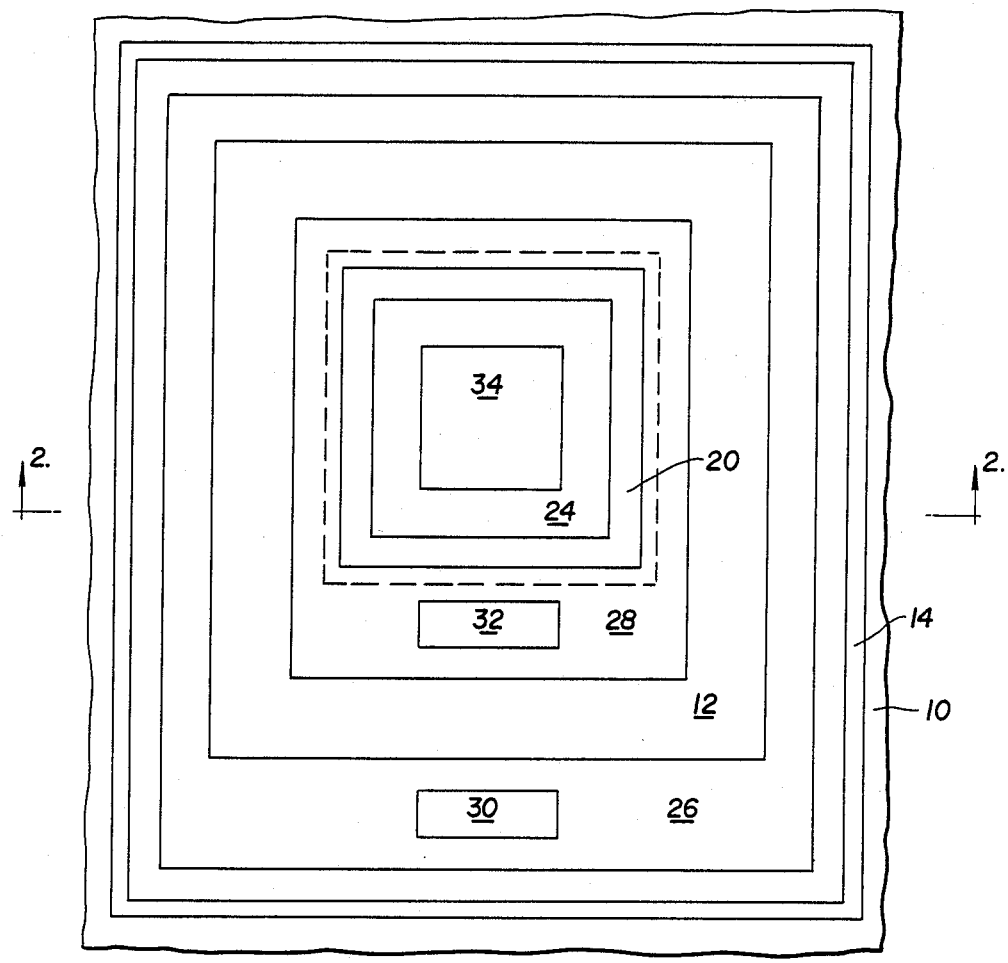
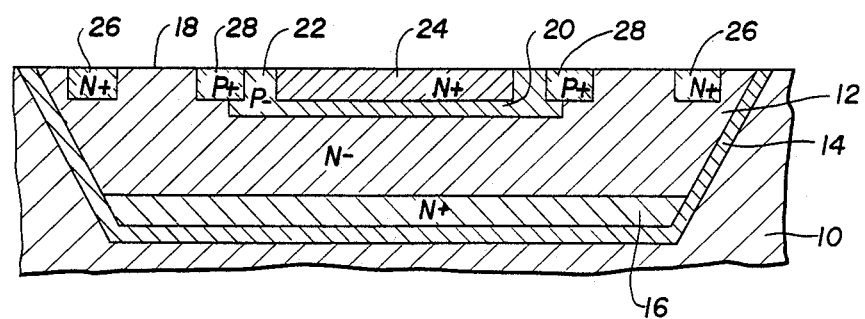
FIG.2

RADIATION HARD, HIGH EMITTER-BASE BREAKDOWN BIPOLAR TRANSISTOR

This is a continuation of application Ser. No. 771,602, filed 2/24/77 now abandoned.

BACKGROUND OF THE INVENTION

1. Field of the Invention

The present invention relates generally to bipolar transistors and more specifically to a vertical inverted bipolar transistor being radiation hardened and having high emitter to base breakdown voltage.

2. Description of the Prior Art

Lateral bipolar transistors generally have a high emitter to base breakdown voltage and a high current gain or beta but lateral transistors are not radiation hardened. Radiation hardened elements are those which have a current gain greater than ten and slowly degrades with neutron radiation, minimizes transient gamma photocurrents and have a surface insensitive to ionizing radiation. Lateral transistors are generally very sensitive to radiation because of the wide base width and other surface related effects.

Generally, vertical transistors have high current gains or beta and are very radiation hardened, but they have a relatively low emitter to base breakdown voltage. Radiation hardness is the result of the very narrow active base width. The major use of inverted vertical transistors has been in integrated injection logic and is generally included in a complementary pair of bipolar transistors.

Though lateral transistors have a high emitter to base breakdown voltage and high current gains, they are not radiation hardened and while vertical transistors are radiation hardened and have high current gain, they do not have a high emitter to base breakdown voltage. Thus there exists a need for a bipolar transistor structure which has a high emitter to base breakdown voltage, a high current gain, and which is radiation hardened.

SUMMARY OF THE INVENTION

The present invention provides a bipolar transistor which is radiation hardened and has a high current gain and emitter to base breakdown voltage. An inverted vertical transistor having narrow active base width, a low base area to collector area ratio, and a high impurity concentration ring at the base to emitter junction provides a structure having the three desired characteristics. The base is formed by introducing impurities into the surface of an emitter region, which may be a dielectrically isolated island, having an impurity concentration of the same order of magnitude as the emitter region. A collector is formed in the surface of the base region having impurity concentration of at least three orders of magnitude greater than the base region and having an area such that the base area to collector area ratio is less than three. A ring of the same conductivity type as the base region is formed in the surface of the base and emitter regions across the junction thereof having an impurity concentration of at least three orders of magnitude greater than the impurity concentration of the base region and having a depth at least greater than the depth of the collector region and not greater than the base region.

OBJECTS OF THE INVENTION

An object of the present invention is to provide a bipolar transistor having an emitter to base breakdown voltage greater than 30 volts and which has maximum radiation hardness.

Another object is to provide a bipolar transistor formed by introducing impurities into a dielectrically insulated island having a high emitter to base breakdown voltage and maximum radiation hardness.

A further object of the invention is to provide an economically produced bipolar transistor structure having emitter to base breakdown voltage greater than 30 volts and maximum radiation hardness.

Still another object of the invention is to provide a vertical bipolar transistor having an emitter to base breakdown voltage greater than 30 volts, current gain greater than 10 and which is radiation hardened.

Other objects, advantages and novel features will become apparent from the following detailed description of the present invention when considered in conjunction with the accompanying drawings.

BRIEF DESCRIPTION OF THE DRAWINGS

FIG. 1 is a planar view of a bipolar transistor embodying the concepts of the present invention.

FIG. 2 is a cross section of the structure of FIG. 1 taken along the lines of 2—2 of FIG. 1.

DESCRIPTION OF THE PREFERRED EMBODIMENTS

FIGS. 1 and 2 illustrate a bipolar transistor incorporating the concepts of the present invention formed in a dielectrically isolated island in substrate 10. The emitter region 12 is surrounded by a dielectric isolation layer 14 and is separated from the dielectric isolation by a high impurity concentration layer 16. Emitter area region 12 may be, for example, silicon doped with phosphorous to have a concentration of $1 \times 10^{15}$ carriers per cubic centimeter, resistance of 3 to 5 carbon ohm-centimeters and a thickness of approximately 20 microns. Region 16 may, for example, be an arsenic doped layer having an impurity concentration of $1 \times 10^{19}$ carriers per cubic centimeter, a sheet resistance of 20 ohms per square and a thickness of approximately 3 microns.

Base region 20 is formed in surface 18 by the introduction of impurities for example, by deposition and diffusion, or ion implantation. Base region 20 may be formed using, for example, boron impurities having a concentration level of about $1 \times 10^{15}$ carriers per cubic centimeter, a sheet resistance of 180 ohms per square, and a depth of 2 to 3 microns. In the surface 22 of base region 20 collector region 24 is formed. Collector region 24 may be of phosphorous impurities having a surface concentration of approximately $2 \times 10^{20}$ carriers per centimeter, a sheet resistance of 5 ohms per square and a depth of approximately 2 microns. An emitter contact ring 26 is formed in surface 18 having the same characteristics as the collector region 24.

In surface 18 of emitter 12 and surface 22 of base 20, a high impurity concentration ring 28 is formed across the surface junction of the emitter and base regions. The ring 28 may be formed by the introduction of boron having a surface impurity concentration of $1 \times 10^{20}$ carriers per cubic centimeter, a sheet resistance of 5 ohms per square and a depth of at least 2 microns. Metal contacts 30, 32, 34 for the emitter, base, and collector regions respectively are illustrated in FIG. 1.

An analysis of the device illustrated in FIGS. 1 and 2 will show that it satisfies the requirements of the present invention to have an emitter to base breakdown voltage greater than 30 volts, current gain greater than 10, and the maximized radiation hardness. The ring 28 at the junction of emitter 12 and the base 20 having an impurity level of at least three orders of magnitude greater than the impurity level of the emitter 12 provides an emitter to base breakdown voltage of approximately 60 volts. The base area to collector area ratio of the device of FIGS. 1 and 2 is approximately 2 and at least less than 3. The high impurity concentration ring 28 around the active base 20 also acts to channel the electron injection from the emitter 12 into the active base region 20 below the collector region 24.

The maximization of the injection of carriers into the active base, the small base area to collector area ratio and the very narrow active base width assures that the current gain or beta of the present device is greater than 10. The narrow base width, which is buried below the surface maximizes hardness to neutron radiation. The high impurity concentration ring 28 which prevents the base surface region inversion during ionizing radiation exposure, maximizes the radiation hardness of the present bipolar transistor. The dielectric insulation layer 14 also minimizes the photo currents which would otherwise be present.

From the preceding description of the preferred embodiments, it is obvious that the objects of the invention are obtained namely a bipolar transistor having a high emitter to base breakdown voltage and being radiation hardened. Although the invention has been described and illustrated in detail, it is to be clearly understood that the same is by way of illustration and example only and is not to be taken by way of limitation. The P and the N areas may be reversed as well as different dopants used to provide the relative impurity levels described. The process described may be performed in any order to produce the desired bipolar transistor structure. The spirit and scope of the invention are to be limited only by the terms of the appended claims.

What is claimed:

1. A vertical bipolar transistor comprising:
   means for operating as an emitter including an emitter region of first conductivity type having a first surface and a low impurity concentration;
   means for operating as a base including a base region of an opposed second conductivity type in said emitter region at said surface;
   means for operating as a collector including a collector region of said first conductivity type in said base region at said surface and extending along a substantial portion of the base surface;
   a ring of said second conductivity type in said emitter and base regions at their junction, speed from the collector region, extending down from said surface at least the depth of said collector region and having a substantially greater impurity concentration than said base region; and
   an emitter contact of said first conductivity type in said emitter region at said surface adjacent to said first ring having a substantially greater impurity concentration than said emitter region and spaced from said first ring a sufficient distance to provide an emitter to base breakdown voltage of greater than thirty volts.

2. The vertical bipolar transistor of claim 1 wherein the base to collector area ratio is less than three.

3. The vertical bipolar transistor of claim 1 wherein said transistor has a maximum designed current gain greater than ten and an emitter to base breakdown voltage greater than thirty volts.

4. The vertical bipolar transistor of claim 1 wherein except at said surface, said emitter region encompasses said base region and said base region encompasses said collector region; and wherein the depth of said ring does not exceed the depth of said base region.

5. The vertical bipolar transistor of claim 1 wherein said emitter region is in a dielectrically insulated island in a substrate.

6. The vertical bipolar transistor of claim 1 wherein said base and emitter regions have an impurity concentration of the order of magnitude of $10^{15}$ carriers per cubic centimeter and said collector region has an impurity concentration of at least two orders of magnitude greater than said base region's.

7. The vertical bipolar transistor of claim 6 wherein said ring has an impurity concentration of at least three orders of magnitude greater than said base region's.

8. The vertical bipolar transistor of claim 1 wherein said emitter, base, and collector regions are portions of a single homogenous semiconductor material.

9. A radiation hard, high emitter to base breakdown voltage level bipolar transistor comprising:
   means for operating as an emitter including an emitter region of first conductivity type having a first surface and an impurity concentration no greater than $5 \times 10^{15}$ carriers per cubic centimeter;
   means for operating as a base including a base region of an opposed second conductivity type in said emitter region at said surface;
   means for operating as a collector including a collector region of said first conductivity type in said base region at said surface;
   a layer of dielectric insulation surrounding the bottom and sides of said emitter region;
   a ring of said second conductivity type in said emitter and base regions at their junction and spaced from said collector region;
   an emitter contact region of said first conductivity in said emitter region at said surface adjacent to said ring and said base region having a substantially greater impurity concentration than said emitter region and spaced from said ring and base regions a sufficient distance to provide an emitter to base breakdown voltage of greater than thirty volts; and
   said transistor has a maximum designed current gain greater than ten.

10. The bipolar transistor of claim 9 wherein, except at said surface, said emitter region encompasses said base region and said base region encompasses said collector region; and wherein the depth of said ring does not exceed the depth of said base region.

11. The bipolar transistor of claim 9 wherein said base and emitter regions have impurity concentration of the same order of magnitude and said collector region has an impurity conconcentration of at least two orders of magnitude greater than said base regions.

12. The bipolar transistor of claim 9 including a ring of said second conductivity type in the surface of said emitter and base regions at their junction, extending down from said surface at least the depth of said collector region but not greater than said base region and having an impurity concentration at least three orders of magnitude greater than the concentration of said base region.

13. A vertical bipolar transistor formed by a process comprising:
  forming a low impurity concentration base region by introducing impurities of a second conductivity type into the surface of a low impurity concentration emitter region of an opposed first conductivity type;
  forming a collector region by introducing impurities of said first conductivity type into the surface of said base region;
  forming a high impurity concentration ring at the junction of said base and emitter regions and spaced from said collector region by introducing impurities of said second conductivity type into the surface of said base and emitter regions to at least the depth of said collector region; and
  forming a high impurity concentration emitter contact region by introducing impurities of said first conductivity type into the surface of said emitter region at a distance spaced from said ring a sufficient distance to provide an emitter to base breakdown voltage of greater than thirty volts.

14. The vertical transistor formed by the process of claim 13 wherein the steps are performed to produce a base region having impurity concentration of the same order of magnitude of $10^{15}$ carriers per cubic centimeter as the emitter region and to produce a collector region having an impurity concentration at least three orders of magnitude greater than said base region's.

15. The vertical transistor formed by the process of claim 13 wherein said ring is formed to have an impurity concentration at least three orders of magnitude greater than said base region's and the depth of said ring does not exceed the depth of said base region.

16. The vertical transistor formed by the process of claim 13 wherein said emitter is a dielectrically insulated island in a substrate.

17. The vertical transistor formed by the process of claim 13 wherein all the steps introduce impurities by deposition and diffusion.

18. The vertical bipolar transistor of claim 1 wherein said emitter region includes a buried layer of said first conductivity type in said emitter region having a substantially greater impurity concentration than said emitter region and spaced from said base region and first ring a sufficient distance to provide said emitter to base breakdown voltage of greater than thirty volts.

19. The bipolar transistor of claim 9 wherein the base to collector area ratio is less than three.

20. The vertical transistor formed by the process of claim 13 wherein the base and collector regions are formed to have a base to collector area ratio of less than three.

* * * * *